United States Patent
Kim et al.

(10) Patent No.: US 10,762,271 B2
(45) Date of Patent: Sep. 1, 2020

(54) MODEL-BASED REFINEMENT OF THE PLACEMENT PROCESS IN INTEGRATED CIRCUIT GENERATION

(71) Applicant: International Business Machines Corporation, Armonk, NY (US)

(72) Inventors: Myung-Chul Kim, Travis, TX (US); Gi-Joon Nam, Chappaqua, NY (US); Shyam Ramji, LaGrange, NY (US); Benjamin N. Trombley, Hopewell Junction, NY (US); Paul G. Villarrubia, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 61 days.

(21) Appl. No.: 16/145,993

(22) Filed: Sep. 28, 2018

(65) Prior Publication Data

US 2020/0104453 A1 Apr. 2, 2020

(51) Int. Cl.
*G06F 30/00* (2020.01)
*G06F 30/398* (2020.01)
(Continued)

(52) U.S. Cl.
CPC .......... *G06F 30/398* (2020.01); *G06F 30/392* (2020.01); *G06F 30/394* (2020.01)

(58) Field of Classification Search
CPC ..... G06F 30/398; G06F 30/394; G06F 30/392
See application file for complete search history.

(56) References Cited

U.S. PATENT DOCUMENTS

| 6,067,409 | A | * | 5/2000 | Scepanovic | ......... | G06F 17/5072 716/119 |
| 6,289,495 | B1 | * | 9/2001 | Raspopovic | .......... | G06F 30/394 716/129 |

(Continued)

OTHER PUBLICATIONS

Jariwala et al., "On Interactions Between Routing and Detailed Placement", IEEE/ACM International Conference on Computer Aided Design, 2004, pp. 1-7.

(Continued)

*Primary Examiner* — Naum Levin
(74) *Attorney, Agent, or Firm* — Cantor Colburn LLP; Erik Johnson

(57) ABSTRACT

A system and method of performing model-based refinement of a placement of components in integrated circuit generation select one of the components as a candidate component and postulate a move of the candidate component from an original position to a new position. The method includes defining nets associated with the candidate component. An initial perimeter and a new perimeter associated with each of the one or more nets are defined. The initial perimeter includes the candidate component at its original position and the new perimeter includes the candidate component at its new position. The method includes quantifying a change from the initial perimeter and the new perimeter and the original position and the new position, and obtaining a model of wires interconnecting the candidate component to the components of each of the nets. A result of the placement is provided for manufacture of the integrated circuit.

20 Claims, 5 Drawing Sheets

(51) Int. Cl.
*G06F 30/392* (2020.01)
*G06F 30/394* (2020.01)

(56) References Cited

U.S. PATENT DOCUMENTS

| | | | | |
|---|---|---|---|---|
| 6,601,226 | B1 * | 7/2003 | Hill | G06F 30/392 |
| | | | | 716/113 |
| 7,076,755 | B2 | 7/2006 | Ren et al. | |
| 7,080,336 | B2 | 7/2006 | Teig et al. | |
| 7,107,556 | B1 | 9/2006 | Etawil et al. | |
| 7,266,796 | B1 * | 9/2007 | Chu | G06F 30/392 |
| | | | | 716/123 |
| 7,966,595 | B1 * | 6/2011 | Chong | G06F 30/392 |
| | | | | 716/118 |
| 8,418,115 | B1 * | 4/2013 | Tom | G06F 17/5072 |
| | | | | 716/105 |
| 8,621,411 | B1 | 12/2013 | Ward | |
| 8,793,636 | B2 * | 7/2014 | Alpert | G06F 30/392 |
| | | | | 716/119 |
| 10,460,062 | B2 * | 10/2019 | Feld | G06F 17/5072 |

OTHER PUBLICATIONS

Roy et al., "Seeing the Forest and the Trees: Steiner Wirelength Optimization in Placement", ISPD '06, Apr. 9-12, 2006, pp. 1-8.
Tsay et al., "Early Wirability Checking and 2-D Congestion-Driven Circuit Placement", Proceedings of the Fifth Annual IEEE International ASIC Conference and Exhibit, 1992, pp. 50-53.

* cited by examiner

MODEL-BASED REFINEMENT OF THE PLACEMENT PROCESS IN INTEGRATED CIRCUIT GENERATION

BACKGROUND

The present invention relates to the generation of an integrated circuit, and more specifically, to model-based refinement of the placement process in integrated circuit generation.

The generation of an integrated circuit (i.e., chip) involves a number of phases including the logic design, physical synthesis, routing, and manufacturing phases. Each of the phases can include multiple processes that can be performed iteratively. The logic design can provide a register transfer level (RTL) description. The physical synthesis phase includes identifying and placing components, such as gate logic, to implement the logic design. After optimizing timing and clocks, a netlist can be produced to indicate the interconnections among components. In the routing phase, the placement of wires that connect gates and other components in the netlist is defined, and in the manufacturing phase, the finalized design is provided for physical implementation of the chip. The placement process within the physical synthesis phase ultimately determines the wiring and wire lengths that are needed in the routing phase. The placement of components that minimizes wire lengths and wiring congestion is desirable.

SUMMARY

Embodiments of the present invention are directed to systems and methods to perform model-based refinement of a placement of components in integrated circuit generation. The method includes selecting one of the components as a candidate component and postulating a move of the candidate component from an original position to a new position, and defining one or more nets associated with the candidate component. Each of the one or more nets includes one or more of the components connected to one or more connections originating at the candidate component. An initial perimeter and a new perimeter associated with each of the one or more nets are defined. The initial perimeter for each net is drawn to include every one of the one or more components included in the net and the candidate component at its original position and the new perimeter is drawn to include every one of the one or more components included in the net and the candidate component at its new position. The method also includes performing computations to quantify a change from the initial perimeter and the new perimeter and the original position and the new position, and obtaining a model of wires interconnecting the candidate component to the one or more components of each of the one or more nets based on a result of the computations. A result of the placement is provided for manufacture of the integrated circuit.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

As previously noted, the physical synthesis phase is one of several that are involved in the generation of an integrated circuit or chip. The placement of components, as part of the physical synthesis phase, affects the subsequent wiring to interconnect those components and, thus, affects the length of wires needed and the congestion of wires that results from the interconnections. Previous placement approaches have included one referred to as a net half perimeter (NHP) approach. This approach is computationally efficient but can ignore components in high fanout nets, which are multiple branches of networks of components. Another prior approach to placement is referred to as routing-inspired wirelength (RWL) model, which employs a Steiner Tree algorithm. This approach provides high accuracy even for high fanout nets but is computationally inefficient and, therefore, impractically slow. Embodiments of the systems and methods detailed herein relate to model-based refinement of the placement process in integrated circuit generation. Specifically, the more efficient NHP approach is used until it is determined that the more computationally intensive RWL approach is needed to assess the impact of the move a component. The determination of the potential moves for which the RWL approach should be employed is detailed.

Figure 1:
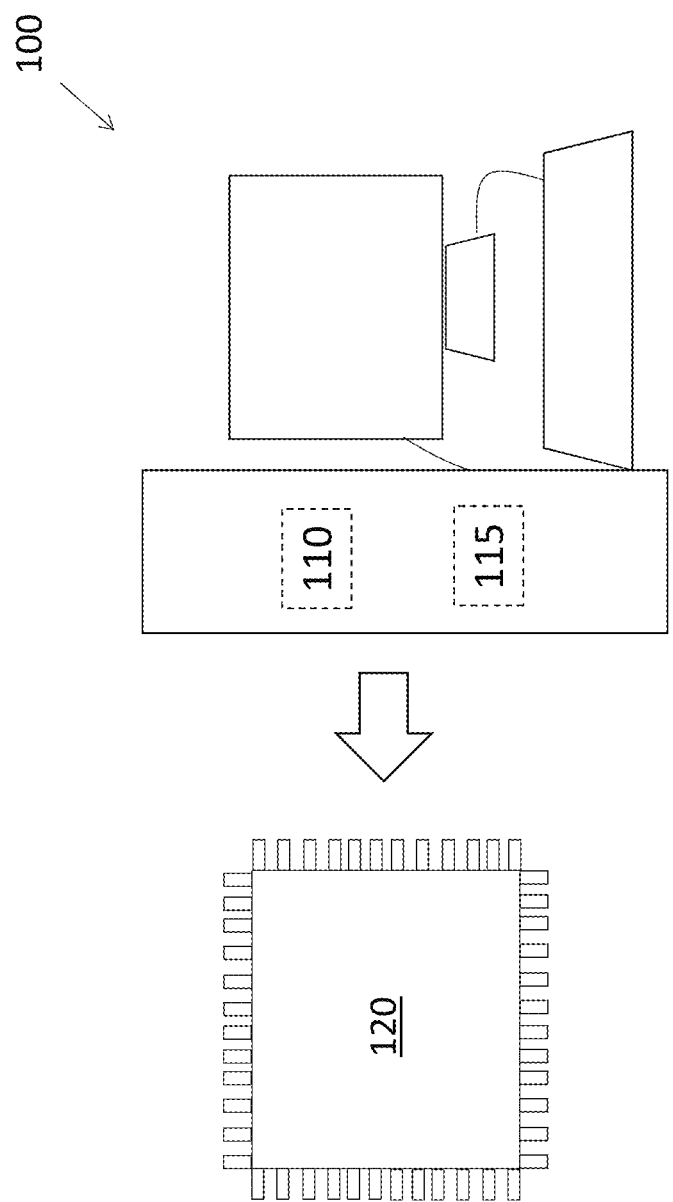
FIG. 1 is a block diagram of a system to perform model-based refinement of wire length determination as part of the placement process in integrated circuit design according to one or more embodiments of the invention.

FIG. 1 is a block diagram of a system 100 to perform model-based refinement of wire length determination as part of the placement process in integrated circuit design according to one or more embodiments of the invention. The system 100 includes processing circuitry 110 and memory 115 that is used to generate the design that is ultimately fabricated into an integrated circuit 120. The steps involved in the fabrication of the integrated circuit 120 are briefly described herein and with reference to FIG. 5. The physical layout is finalized, in part, based on the boundary assertion-based power recovery according to embodiments of the invention. The finalized physical layout is provided to a foundry. Masks are generated for each layer of the integrated circuit 120 based on the finalized physical layout. Then, the wafer is processed in the sequence of the mask order. The processing includes photolithography and etch. The fabrication is further discussed with reference to FIG. 5.

Figure 2:
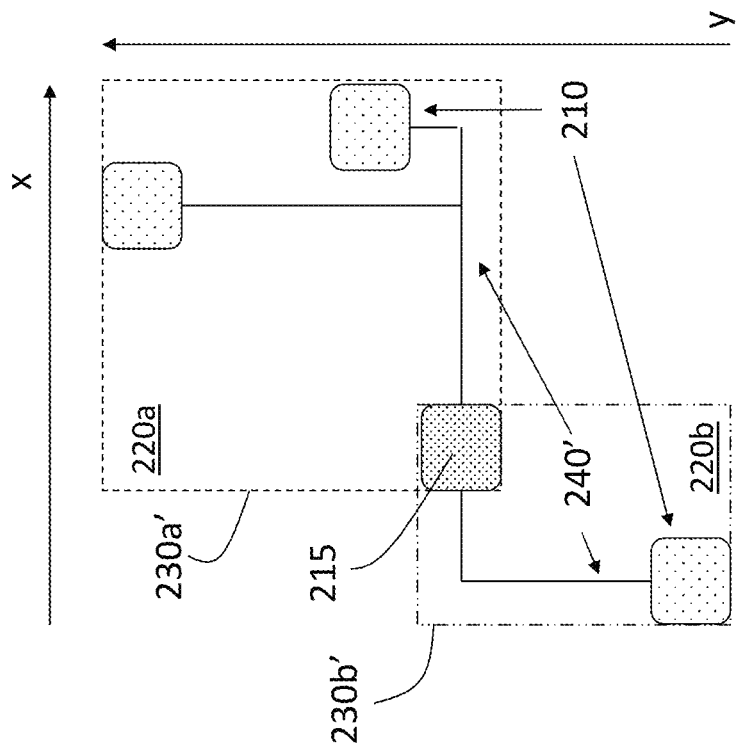
FIG. 2 illustrates exemplary net half perimeter and routing-inspired wirelength approaches to placement that can be employed according to one or more embodiments of the invention.
Figure 2:
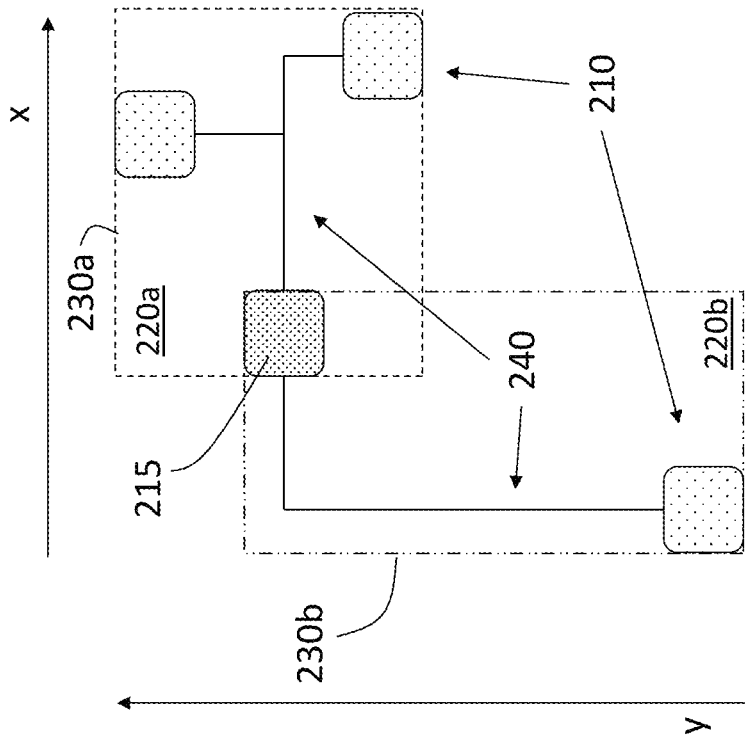

FIG. 2 illustrates NHP and RWL approaches to placement that can be employed according to one or more embodiments of the invention. As previously noted, placement refers to the positioning of components of the integrated circuit. This placement of components controls the routing of wires that is needed to interconnect them. As a starting point, all the components are initially placed. The movement of the components is analyzed using either the NHP approach alone or, additionally, the RWL approach according to the embodiments detailed herein. For explanatory purposes, the component being moved is referred to as the candidate node 215 and all other components are referred to as nodes 210. Each node will be treated as a candidate node 215, in turn. The integrated circuit can be subdivided at different hierarchical levels (e.g., cores including units that include macros), and the placement process described herein can be performed for nodes 210 in the entire integrated circuit or at any of the hierarchical levels.

FIG. 2 shows the result of both the NHP and RWL approaches. The result of the NHP approach is the perimeters 230 and the result of the RWL approach is the connections 240. The x and y dimensions are indicated as an exemplary way to quantify the perimeters 230. A number of units in the x-direction and a number of units in the y-direction define the two dimensions of each perimeter 230, and the sum of the number of units in the x-direction and the number of units in the y-direction for a given perimeter 230 is the half perimeter (hp) value for that perimeter 230. As FIG. 2 indicates, the candidate node 215 and other nodes 210 have connections 240 between them. The connections 240 represent wires based on the manufacturing process that follows the physical synthesis. If only the NHP approach were used, the perimeters 230 would be present but tracks of the connections 240 would not be detailed as they are based on the RWL approach.

Each connection 240 stemming from the candidate node 215 defines a net 220 that includes all the nodes 210 that are reached by that connection 240. As shown in FIG. 2, for example, net 220a defines a net that includes two nodes 210 connected to the candidate node 215, and net 220b defines another net that includes one node 210 connected to the candidate node 215. While two nets 220 are shown in FIG. 2, the exemplary case is not intended to limit the number of nets 220 that can be associated with a given candidate node 215. The perimeters 230 around each of the nets 220 represent the result of the NHP approach. Specifically, as FIG. 2 indicates, the perimeter 230a is around the candidate node 215 and the other two nodes 210 of the net 220a, and the perimeter 230b is around the candidate node 215 and the other node 210 of the net 220b.

When the candidate node 215 is moved to a new position, as shown, both the perimeters 230 and the connections 240 change as a result. Specifically, the perimeter 230a around net 220a expands to perimeter 230a' (the number of units in both the x and y dimensions has increased), and the perimeter 230b around net 220b shrinks to perimeters 230b' (the number of units in both the x and y dimensions has decreased). Similarly, the connection 240 lengths prior to the move change to connections 240', which are longer in net 220a but shorter in net 220b. These connections 240, 240' would not be known without using the RWL approach. Thus, because one perimeter 230a increases while the other perimeter 230b decreases, it would be difficult to determine the effect on total wirelength, which is represented by the difference in connections 240 and 240', using the NHP approach alone.

In other scenarios, the NHP approach can be sufficient to determine the effect of a move of a candidate node 215. For example, if both perimeters 230a' and 230b' were larger than the respective original perimeters 230a and 230b, the move of candidate 215 could be deemed undesirable without an additional RWL mode. A determination of when the RWL approach, and the computational cost associated with it, is necessary is discussed with reference to FIG. 3.

Figure 3:
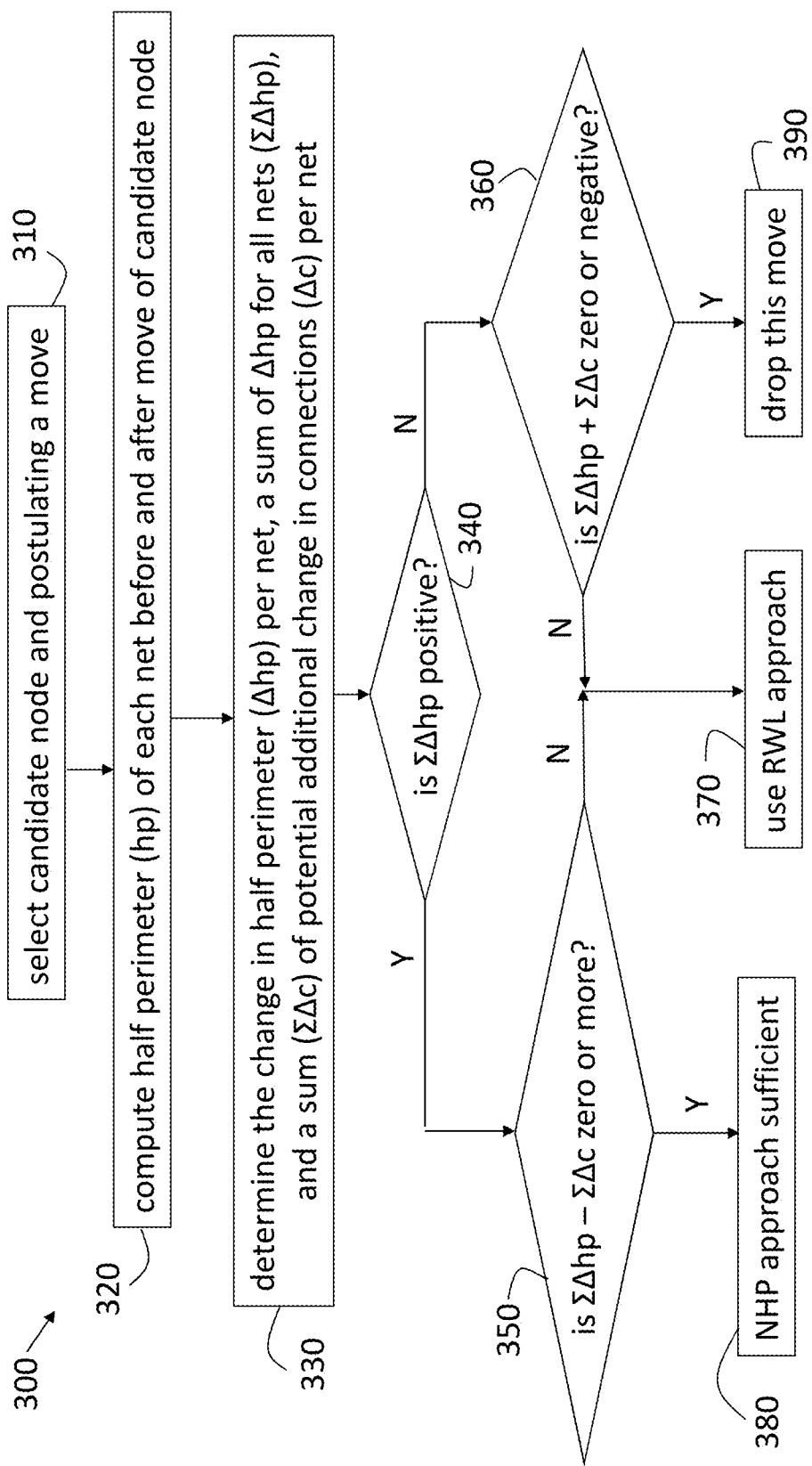
FIG. 3 is a process flow of a method of performing model-based refinement of the placement process in integrated circuit generation according to an exemplary embodiment.

FIG. 3 is a process flow of a method 300 of performing model-based refinement of the placement process in integrated circuit generation according to an exemplary embodiment. As previously noted, the model-based refinement refers to using the RWL approach to generate a wirelength model only when the processes detailed with reference to FIG. 3 indicate that the RWL approach is additionally necessary. That is, the processes indicate when the NHP approach is sufficient and when the RWL approach must additionally be pursued for the evaluation. The processes are exemplary, and a change in the way that dimensions used in the processes are determined (e.g., x and y dimensions are considered in the opposite directions such that a move to the left is an increase in the x dimension) will change the flow shown in FIG. 3. The processes pertain to the way to evaluate a move of a component from the initial position. The processes shown in FIG. 3 are preceded by an initial placement of the components. The processes are performed iteratively with one node 210 selected as the candidate node 215 per iteration. The processes can also be repeated for the same node 210 selected as the candidate node 215 based on a result of a previous implementation of the processes.

At block 310, the processes include selecting a candidate node 215 and postulating a move to a new position from the initial position of the candidate node 215. Selecting the candidate node 215 refers to selecting one of the components at whatever hierarchical level the placement process is being performed. At block 320, the processes include computing the hp value of each net before and after the move of the candidate node. As previously noted, for a given perimeter 230 around a given net 220, the hp is the sum of the number of units in the x-direction and the number of units in the y-direction. Thus, for a perimeter 230 with N units in the x dimension and M units in the y dimension, the hp is N+M. When the perimeter 230 of the given net 220 changes based on the postulated move of the candidate node 215, the resulting perimeter 230' can have N' units in the x dimension and M' units in the y dimension for an hp' of N'+M'.

At block 330, the processes include determining a change in hp ($\Delta$hp) for each net 220, a sum of the changes in hp ($\Sigma\Delta$hp) for all the nets 220, and a potential additional change in connections 240 ($\Delta$c) per net 220. The $\Delta$hp for the given exemplary node 220 discussed above is hp-hp' or (N+M)−(N'+M'). The $\Delta$hp for all the nets 220 associated with the candidate node 215 are added to obtain $\Sigma\Delta$hp. The $\Delta$c for a given net 220 is given by a difference between the total movement of the candidate node 215 and the absolute value of $\Delta$hp for the net 220.

As previously noted, the positions of the candidate node 215 and other nodes 210 can be considered in perpendicular x and y dimensions. For example, the positions can be determined according to a number of equidistant units in the x dimension and in the y dimension. In this case, the position can be indicated as (x-position,y-position), where x-position is the number of units from a designated (0,0) position in x dimension, and y-position is the number of units from the designated (0,0) position in the y dimension. Thus if (X,Y) defines the initial position of the candidate node 215 and (X',Y') defines the position of the candidate node 215 after the postulated move, the total movement of the candidate node 215 can be computed as |X-X'|+|Y-Y'|. The $\Delta$c for a given net 220 is then given by: (|X-X'|+|Y-Y'|)−|$\Delta$hp|. This value acts as a proxy estimate for the result of the RWL approach without first having implemented the RWL approach. A large value of $\Delta$c relative to $\Delta$hp suggests that the RWL approach is needed because the potential additional change in connections 240 is a larger factor in the evaluation than the change in half perimeter. The sum $\Sigma\Delta c$ of $\Delta c$ values for every net 220 associated with the candidate node 215 can be obtained from the $\Delta c$ for each net 220.

At block 340, a check is done of whether $\Sigma\Delta hp$ is positive. If it is, this suggests that the move of the candidate node 215 is desirable. In this case, another check is done, at block 350, of whether $\Sigma\Delta hp-\Sigma\Delta c$ is zero or more (i.e., a positive value). As previously noted, a positive value of $\Sigma\Delta hp-\Sigma\Delta c$ indicates that the change in half perimeter is more of a factor in the evaluation of the move of the candidate node 215 than the potential additional change in connections 240. Thus, in this case, at block 380, a determination is made that the NHP approach is sufficient to decide if the proposed move of the candidate node 215 is desirable. If, based on the check at block 350, it is determined that $\Sigma\Delta hp-\Sigma\Delta c$ is not zero or more, a decision is made, at block 370, to use the RWL approach to further evaluate the proposed move of the candidate node 215.

If the check at block 340 indicates that $\Sigma\Delta hp$ is not positive, then a further check is done, at block 360, of whether $\Sigma\Delta hp+\Sigma\Delta c$ is zero or negative. If it is, it indicates that the perimeter increased (i.e., $\Sigma\Delta hp$ is a negative value). In this case, a determination is made, at block 390, to drop the potential move of the candidate node 215 and try a different placement. If, instead, the check at block 360 indicates that $\Sigma\Delta hp+\Sigma\Delta c$ is positive, then a decision is made, at block 370, to use the RWL for further evaluation of the potential move of the candidate node 215. The processes discussed with reference to FIG. 3 are further discussed for an exemplary proposed move of a candidate node 215 illustrated in FIG. 4.

Figure 4:
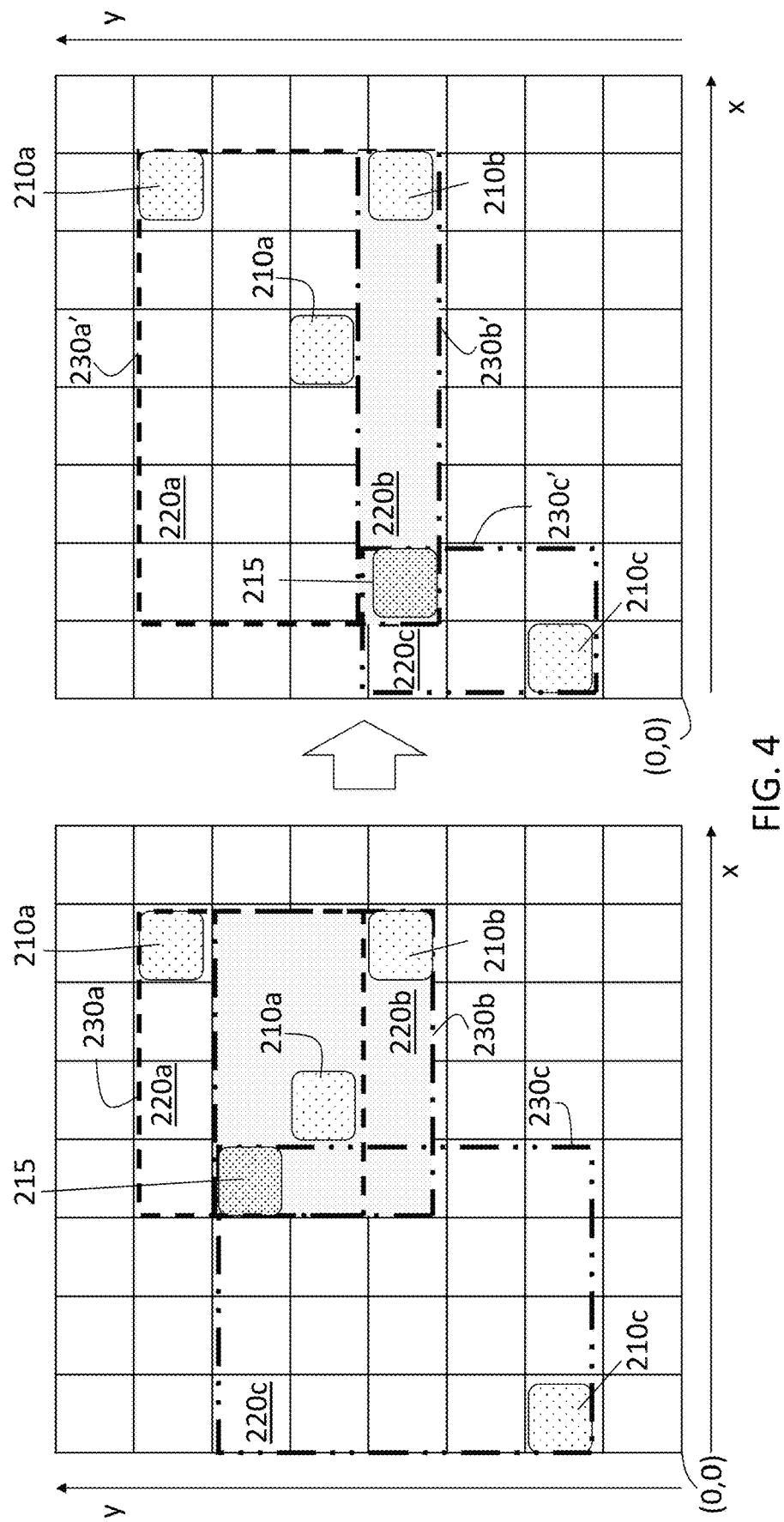
FIG. 4 illustrates an example of model-based refinement of the placement process according to one or more embodiments of the invention.

FIG. 4 illustrates an example of model-based refinement of the placement process according to one or more embodiments of the invention. Specifically, the processes detailed with reference to FIG. 3 are used to assess a postulated move of candidate node 215. The candidate node 215 and other nodes 210a, 210b, 210c are shown on a grid with each grid representing a unit in the x dimension and y dimension for explanatory purposes. The bottom left corner of the grid is indicated as the point at which x=0 and y=0. Three nets 220a, 220b, 220c are shown corresponding nodes 210a, 210b, 210c connected to the candidate node 215. No connections 240 are shown in FIG. 4, because the illustrated scenarios occur prior to any decision about whether the RWL approach should be used to evaluate the proposed move of the candidate node 215. As the grid in FIG. 4 indicates, the position of the candidate node 215 goes from (4,6) to (2,4). Thus, the total movement of the candidate node 215 according to the proposed move is |4−2|+|6−4| or 4 units. Other values discussed with reference to FIG. 3 that are specific to each net 220 are indicated in Table 1.

TABLE 1

Exemplary values used in model-based refinement of the placement process.

| Net | hp | hp' | $\Delta$hp | $\Delta$c |
|---|---|---|---|---|
| 220a | 7 | 10 | −3 | 1 |
| 220b | 5 | 7 | −2 | 2 |
| 220c | 9 | 5 | 4 | 0 |

As Table 1 indicates, $\Sigma\Delta hp$ is the sum of −3, −2, and 4 or −1. Since $\Sigma\Delta hp$ is not positive, the check at block 340 would lead to the additional check at block 360. According to Table 1, $\Sigma\Delta c$ is the sum of 1, 2, and 0 or 3. Since $\Sigma\Delta hp+\Sigma\Delta c$ is then −1+3 or 2, which is not zero or a negative number, the check at block 360 would lead to block 370. That means that the, for the exemplary move of the candidate node 215 shown in FIG. 4, the RWL approach is additionally needed to evaluate whether the move should be made.

Figure 5:
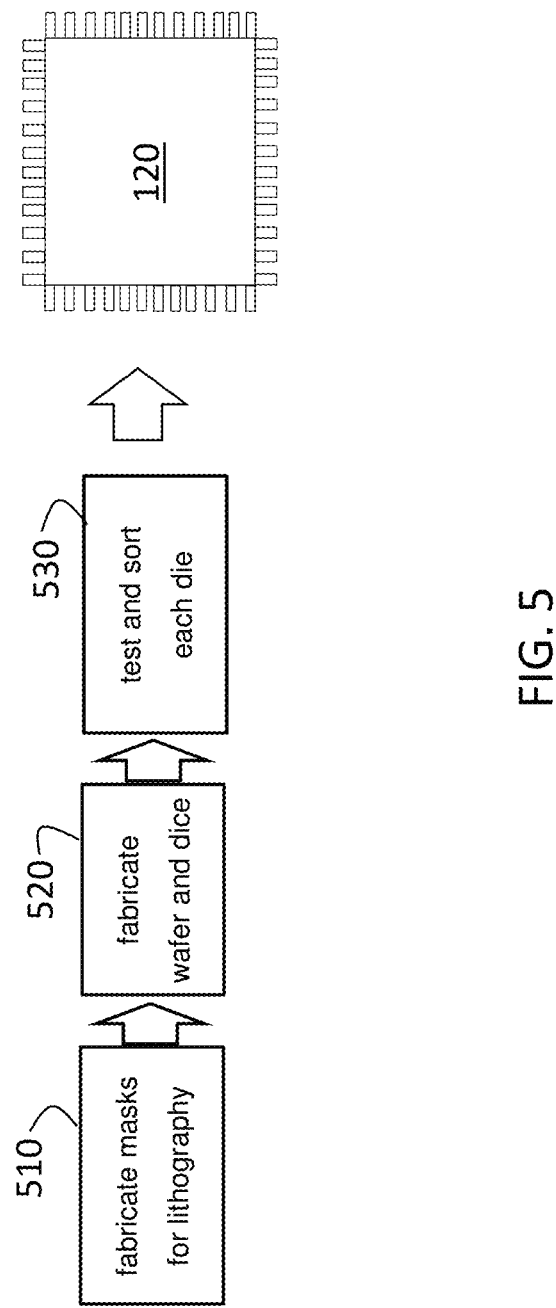
FIG. 5 is a process flow of a method of fabricating the integrated circuit designed according to one or more embodiments of the invention

FIG. 5 is a process flow of a method of fabricating the integrated circuit 120 designed according to one or more embodiments of the invention. Once the physical synthesis phase and other phases are completed, based, in part, on the model-based refinement of the placement process according to one or more embodiments of the invention, the processes shown in FIG. 5 can be performed to fabricate the integrated circuit 120. Generally, a wafer with multiple copies of the final design is fabricated and cut (i.e., diced) such that each die is one copy of the integrated circuit 120. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of performing model-based refinement of a placement of components in integrated circuit generation, the method comprising:
   selecting, using a processor, one of the components as a candidate component and postulating a move of the candidate component from an original position to a new position;
   defining, using the processor, one or more nets associated with the candidate component, wherein each of the one or more nets includes one or more of the components connected to one or more connections originating at the candidate component;
   defining, using the processor, an initial perimeter and a new perimeter associated with each of the one or more nets, wherein the initial perimeter for each net is drawn to include every one of the one or more components included in the net and the candidate component at its original position and the new perimeter is drawn to include every one of the one or more components included in the net and the candidate component at its new position;
   performing, using the processor, computations to quantify a change from the initial perimeter and the new perimeter and the original position and the new position;
   obtaining, by the processor, a model of wires interconnecting the candidate component to the one or more components of each of the one or more nets based on a result of the computations; and
   providing a result of the placement for manufacture of the integrated circuit.

2. The computer-implemented method according to claim 1, wherein the performing the computations includes determining a half perimeter (hp) value associated with the initial perimeter and with the new perimeter for each of the one or more nets, a sum of a change in hp ($\Sigma\Delta hp$) for each of the one or more nets, a potential additional change in connections ($\Delta c$) between the candidate component and the one or more components in each of the one or more nets, and a sum of the $\Delta c$ ($\Sigma\Delta c$) for each of the one or more nets.

3. The computer-implemented method according to claim 2, wherein the determining the hp value for the initial perimeter for each of the one or more nets (hp') includes adding a width and a height of the initial perimeter for each of the one or more nets, the determining the hp value for the new perimeter for each of the one or more nets (hp") includes adding the width and the height of the new perimeter for each of the one or more nets, determining the change in hp ($\Delta hp$) for each of the one or more nets includes performing hp'−hp" for each of the one or more nets, and the determining the $\Sigma\Delta hp$ includes adding the $\Delta hp$ for all of the one or more nets.

4. The computer-implemented method according to claim 2, further comprising determining a total movement of the candidate component as a sum of an absolute value of a change in a first dimension and an absolute value of the change in a second dimension, perpendicular to the first dimension, between the original position and the new position of the candidate component.

5. The computer-implemented method according to claim 4, wherein the determining the $\Delta c$ for each of the one or more nets includes subtracting an absolute value of $\Delta hp$ from the total movement of the candidate component, and the determining the $\Sigma\Delta c$ includes adding the $\Delta c$ for all of the one or more nets.

6. The computer-implemented method according to claim 2, wherein the obtaining the model of wires based on the result of the computations includes determining whether a subtraction, $\Sigma\Delta hp - \Sigma\Delta c$, is zero or a positive value and obtaining the model of wires based on the subtraction being a negative value.

7. The computer-implemented method according to claim 2, wherein the obtaining the model of wires based on the result of the computations includes determining whether a sum, $\Sigma\Delta hp + \Sigma\Delta c$, is zero or a negative value and obtaining the model of wires based on the sum being a positive value.

8. A system performing model-based refinement of a placement of components in integrated circuit generation, the system comprising:
   a memory device configured to store an initial placement of the components; and
   a processor configured to select one of the components as a candidate component and postulate a move of the candidate component from an original position in the initial placement to a new position, to define one or more nets associated with the candidate component, wherein each of the one or more nets includes one or more of the components connected to one or more connections originating at the candidate component, to define an initial perimeter and a new perimeter associated with each of the one or more nets, wherein the initial perimeter for each net is drawn to include every one of the one or more components included in the net and the candidate component at its original position and the new perimeter is drawn to include every one of the one or more components included in the net and the candidate component at its new position, to perform computations to quantify a change from the initial perimeter and the new perimeter and the original position and the new position, and to obtain a model of wires interconnecting the candidate component to the one or more components of each of the one or more nets based on a result of the computations, wherein a result of the placement is provided for manufacture of the integrated circuit.

9. The system according to claim 8, wherein the processor performing the computations includes determining a half perimeter (hp) value associated with the initial perimeter and with the new perimeter for each of the one or more nets, a sum of a change in hp ($\Sigma\Delta hp$) for each of the one or more nets, a potential additional change in connections ($\Delta c$) between the candidate component and the one or more components in each of the one or more nets, and a sum of the $\Delta c$ ($\Sigma\Delta c$) for each of the one or more nets.

10. The system according to claim 9, wherein the processor performing the computations includes determining the hp value for the initial perimeter for each of the one or more nets (hp') by adding a width and a height of the initial perimeter for each of the one or more nets, determining the hp value for the new perimeter for each of the one or more nets (hp") by adding the width and the height of the new perimeter for each of the one or more nets, determining the change in hp ($\Delta hp$) for each of the one or more nets by performing hp'−hp" for each of the one or more nets, and determining the $\Sigma\Delta hp$ by adding the $\Delta hp$ for all of the one or more nets.

11. The system according to claim 9, wherein the processor is further configured to compute a total movement of the candidate component as a sum of an absolute value of a change in a first dimension and an absolute value of the change in a second dimension, perpendicular to the first dimension, between the original position and the new position of the candidate component.

12. The system according to claim 11, wherein the processor determines the $\Delta c$ for each of the one or more nets by subtracting an absolute value of $\Delta hp$ from the total movement of the candidate component and determines the $\Sigma \Delta c$ by adding the $\Delta c$ for all of the one or more nets.

13. The system according to claim 9, wherein the processor obtaining the model of wires based on the result of the computations includes determining whether a subtraction, $\Sigma \Delta hp - \Sigma \Delta c$, is zero or a positive value and obtaining the model of wires based on the subtraction being a negative value.

14. The system according to claim 9, wherein the processor obtaining the model of wires based on the result of the computations includes determining whether a sum, $\Sigma \Delta hp + \Sigma \Delta c$, is zero or a negative value and obtaining the model of wires based on the sum being a positive value.

15. A computer program product for performing model-based refinement of a placement of components in integrated circuit generation, the computer program product comprising a computer readable storage medium having program instructions embodied therewith, the program instructions executable by a processor to perform a method comprising:
selecting one of the components as a candidate component and postulating a move of the candidate component from an original position to a new position;
defining one or more nets associated with the candidate component, wherein each of the one or more nets includes one or more of the components connected to one or more connections originating at the candidate component;
defining an initial perimeter and a new perimeter associated with each of the one or more nets, wherein the initial perimeter for each net is drawn to include every one of the one or more components included in the net and the candidate component at its original position and the new perimeter is drawn to include every one of the one or more components included in the net and the candidate component at its new position;
performing computations to quantify a change from the initial perimeter and the new perimeter and the original position and the new position; and
obtaining a model of wires interconnecting the candidate component to the one or more components of each of the one or more nets based on a result of the computations, wherein a result of the placement is provided for manufacture of the integrated circuit.

16. The computer program product according to claim 15, wherein the performing the computations includes determining a half perimeter (hp) value associated with the initial perimeter and with the new perimeter for each of the one or more nets, a sum of a change in hp ($\Sigma \Delta hp$) for each of the one or more nets, a potential additional change in connections ($\Delta c$) between the candidate component and the one or more components in each of the one or more nets, and a sum of the $\Delta c$ ($\Sigma \Delta c$) for each of the one or more nets.

17. The computer program product according to claim 16, wherein the determining the hp value for the initial perimeter for each of the one or more nets (hp') includes adding a width and a height of the initial perimeter for each of the one or more nets, the determining the hp value for the new perimeter for each of the one or more nets (hp") includes adding the width and the height of the new perimeter for each of the one or more nets, determining the change in hp ($\Delta hp$) for each of the one or more nets includes performing hp'−hp" for each of the one or more nets, and the determining the $\Sigma \Delta hp$ includes adding the $\Delta hp$ for all of the one or more nets.

18. The computer program product according to claim 16, further comprising determining a total movement of the candidate component as a sum of an absolute value of a change in a first dimension and an absolute value of the change in a second dimension, perpendicular to the first dimension, between the original position and the new position of the candidate component, wherein the determining the $\Delta c$ for each of the one or more nets includes subtracting an absolute value of $\Delta hp$ from the total movement of the candidate component, and the determining the $\Sigma \Delta c$ includes adding the $\Delta c$ for all of the one or more nets.

19. The computer program product according to claim 16, wherein the obtaining the model of wires based on the result of the computations includes determining whether a subtraction, $\Delta hp - \Sigma \Delta c$, is zero or a positive value and obtaining the model of wires based on the subtraction being a negative value.

20. The computer program product according to claim 16, wherein the obtaining the model of wires based on the result of the computations includes determining whether a sum, $\Delta hp + \Sigma \Delta c$, is zero or a negative value and obtaining the model of wires based on the sum being a positive value.

* * * * *